(12) United States Patent
Lai et al.

(10) Patent No.: US 7,457,122 B2
(45) Date of Patent: Nov. 25, 2008

(54) MEMORY MODULE ASSEMBLY INCLUDING A CLIP FOR MOUNTING A HEAT SINK THEREON

(75) Inventors: Cheng-Tien Lai, Tu-Cheng (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,225

(22) Filed: Jul. 13, 2006

(65) Prior Publication Data

US 2007/0195489 A1 Aug. 23, 2007

(30) Foreign Application Priority Data

Feb. 22, 2006 (CN) .................. 2006 1 0033941

(51) Int. Cl.
*H05K 7/20* (2006.01)

(52) U.S. Cl. .................. 361/704; 361/715; 361/719; 257/707; 257/719

(58) Field of Classification Search .......... 361/704, 361/710, 715, 728, 799, 600, 719, 28; 165/80.3, 165/165, 185; 174/16.3; 257/E23.086, 713, 257/718–719; 29/829
See application file for complete search history.

(56) References Cited

U.S. PATENT DOCUMENTS

| | | | | |
|---|---|---|---|---|
| 3,506,877 A | * | 4/1970 | Mickey ...................... 361/715 |
| 5,109,318 A | * | 4/1992 | Funari et al. ................. 361/710 |
| 5,966,287 A | * | 10/1999 | Lofland et al. .............. 361/704 |
| 6,119,765 A | * | 9/2000 | Lee ............................ 165/80.3 |
| 6,233,150 B1 | * | 5/2001 | Lin et al. ..................... 361/704 |
| 6,297,966 B1 | * | 10/2001 | Lee et al. .................... 361/799 |
| 6,765,797 B2 | * | 7/2004 | Summers et al. ........... 361/704 |
| 7,221,569 B2 | * | 5/2007 | Tsai ............................ 361/704 |
| 7,349,220 B2 | * | 3/2008 | Lai et al. ..................... 361/719 |
| 7,375,964 B2 | * | 5/2008 | Lai et al. ..................... 361/704 |
| 2003/0026076 A1 | * | 2/2003 | Wei ............................ 361/704 |
| 2007/0195489 A1 | * | 8/2007 | Lai et al. ..................... 361/600 |
| 2007/0206359 A1 | * | 9/2007 | Lai et al. ..................... 361/715 |
| 2007/0217160 A1 | * | 9/2007 | Legen et al. ................ 361/704 |

* cited by examiner

*Primary Examiner*—Jaypraksh N Gandhi
*Assistant Examiner*—Courtney L Smith
(74) *Attorney, Agent, or Firm*—Frank R. Niranjan

(57) ABSTRACT

A memory module assembly includes a printed circuit board (10) having a heat-generating electronic component (14) thereon, and first and second heat-dissipation plates (20), (30) attached on opposite sides of the printed circuit board. The first heat-dissipation plate includes a first hook (24) extending from a side thereof and the first hook includes a resisting portion (242) extending from an end of the first heat-dissipation plate and a first engaging portion (244) extending from a free end of the resisting portion for resisting the printed circuit board and the second heat-dissipation plate. The second heat-dissipation plate defines a depressed portion (34) in a side thereof for engaging with the first hook. The other sides of the first and second heat-dissipation plates engage with each other to clamp the printed circuit board between the first and second heat-dissipation plates.

12 Claims, 4 Drawing Sheets

MEMORY MODULE ASSEMBLY INCLUDING A CLIP FOR MOUNTING A HEAT SINK THEREON

FIELD OF THE INVENTION

The present invention relates generally to a memory module assembly, and more particularly to a memory module assembly including a clip and a heat sink, where the heat sink is mounted to an electronic component attached on a surface of a printed circuit board of the memory module assembly via the clip.

DESCRIPTION OF RELATED ART

The memory module assemblies that are currently in the use generally do not require cooling devices to dissipate heat as they are operated on or below 66 MHz and do not generate enough heat to require a cooling device. However, as the industry progresses, memory module assemblies, such SDRAM DIMM memory module assemblies may be required to operate at 100 MHz or above. For these up-to-date memory module assemblies, heat sinks will be required to remove heat generated thereby. However, since the memory module assemblies have small board areas and are usually mounted on an already crowded motherboard of a computer, the mounting of such a heat sink on the memory module assembly becomes an issue.

SUMMARY OF THE INVENTION

A memory module assembly in accordance with a preferred embodiment of the present invention includes a printed circuit board having a heat-generating electronic component thereon, and first and second heat-dissipation plates attached on opposite sides of the printed circuit board. The first heat-dissipation plate includes a first hook extending from a side thereof and the first hook includes a resisting portion extending from an end of the first heat-dissipation plate and a first engaging portion extending from a free end of the resisting portion for resisting the printed circuit board and the second heat-dissipation plate. The second heat-dissipation plate defines a depressed portion in a side thereof for engaging with the first hook. The other sides of the first and second heat-dissipation plates engage with each other to clamp the printed circuit board between the first and second heat-dissipation plates.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
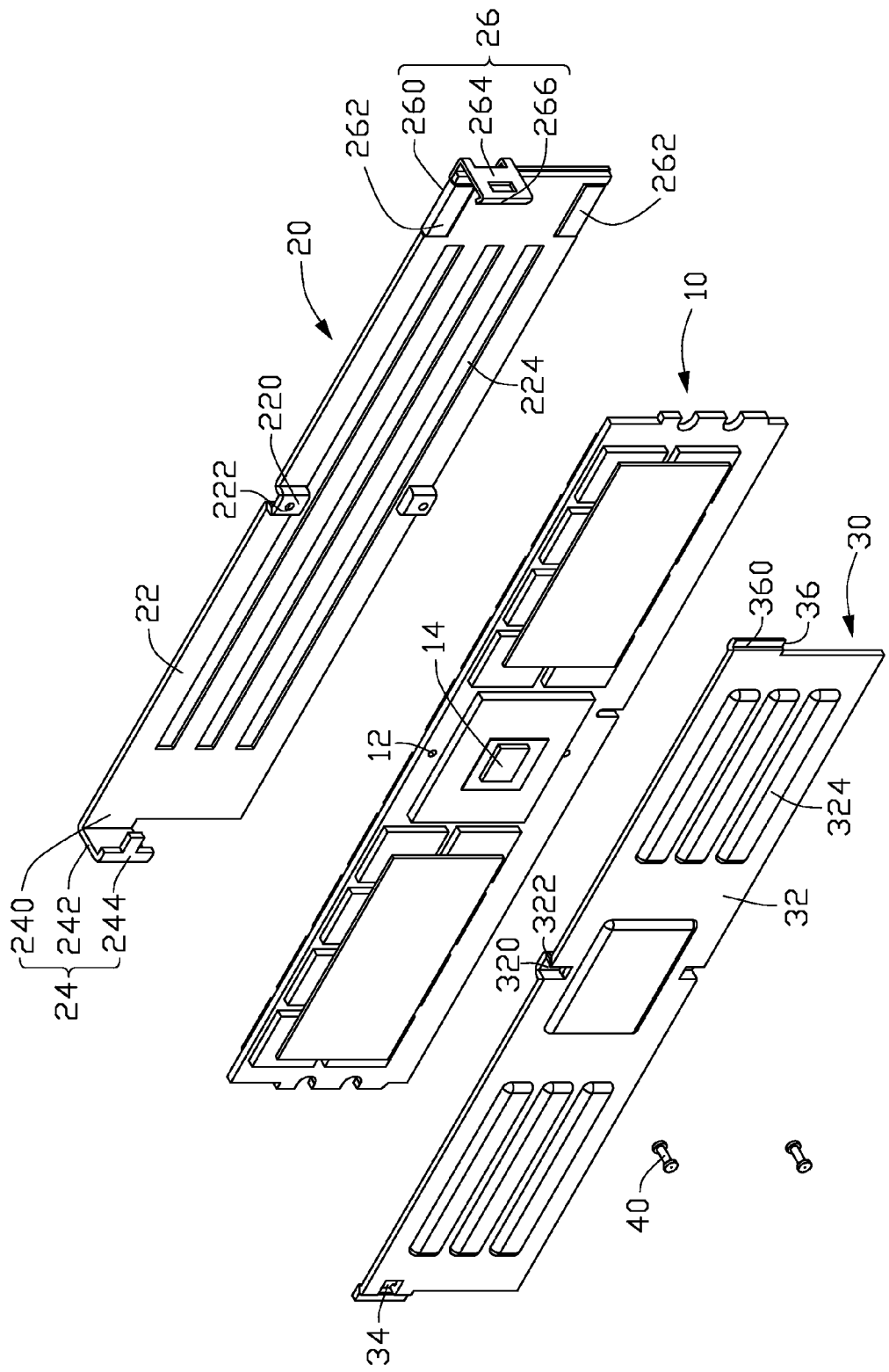
FIG. 1 is an isometric, exploded view of a memory module assembly in accordance with a preferred embodiment of the present invention.
Figure 2:
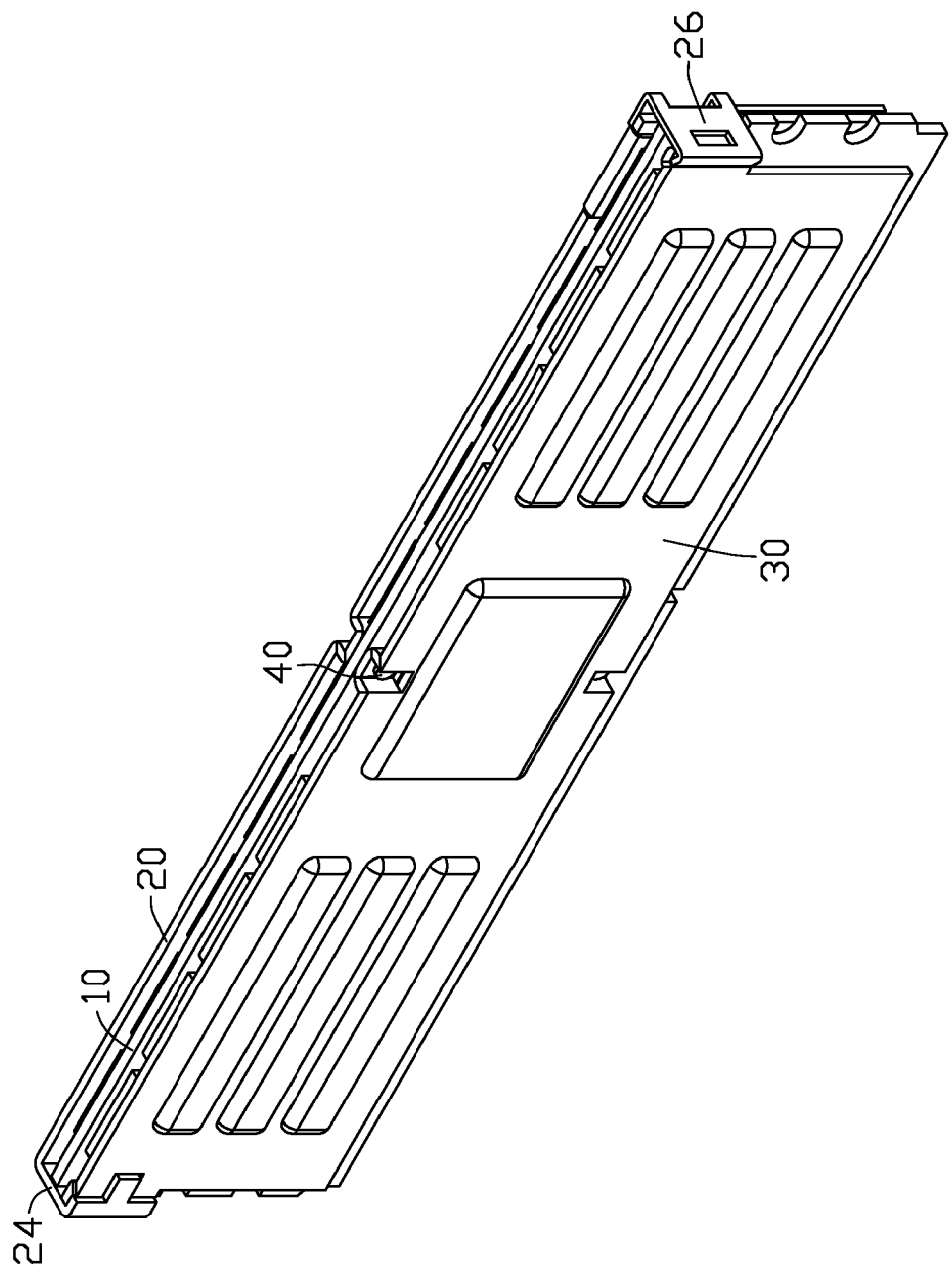
FIG. 2 is an assembled view of FIG. 1.

Referring to FIGS. 1-2, a memory module assembly in accordance with a preferred embodiment of the present invention comprises a printed circuit board 10 with a heat-generating electronic component 14 mounted on a front surface thereof, and first and second heat-dissipation plates 20, 30 attached on opposite sides of the printed circuit board 10. The heat-generating electronic component 14 intimately contacts with the second heat-dissipation plate 30 whereby heat generated by the heat-generating electronic component 14 is absorbed and dissipated by the second heat-dissipation plate 30. The printed circuit board 10 has a substantially rectangular shape and defines a pair of through holes 12.

The first heat-dissipation plate 20 comprises a rectangular-shaped first body 22. The first body 22 is shorter than the printed circuit board 10. The first body 22 has a pair of long sides and a pair of short sides. Three spaced grooves 224 are defined in a front face of the first body 22 and are recessed in a direction along the long sides of the first body 22 to form ribs (not shown) on a rear face of the first body 22 in a manner so as to strengthen the first body 22. A pair of protruding portions 220 are located in upper and lower ends of the front face of the first body 22 and a through hole 222 is defined in each protruding portion 220 for a fastener, for example a rivet 40, to extend through to connect the first heat-dissipation plate 20, the printed circuit board 10 and the second heat-dissipation plate 30 together. First and second hooks 24, 26 inwardly extend from edges of the short sides of the first body 22. The first hook 24 comprises a spreading portion 240 extending from the edge of one of the short sides of the first body 22. A resisting portion 242 extends from an edge of the spreading portion 240 and perpendicular to the first body 22. A first engaging portion 244 extends from a free end of the resisting portion 242 and parallel to the first body 22, for facilitating an engagement of the first hook 24 with the second heat-dissipation plate 30. The first engaging portion 244 has a T shape allowing it to engage with the second heat-dissipation plate 30. The second hook 26 is an elastic piece attached on an end portion of the first body 22 and has a section 260 attached on the end portion of the rear face of the first body 22. A pair of locking portions 262 clamp on upper and lower ends of the first body 22. A blocking portion 264 inwardly extends from an edge of the other short side of the first body 22 and perpendicular to the first body 22 and a second engaging portion 266 extends from a free end of the blocking portion 264 and inclined to the first body 22, for facilitating an engagement of the second hook 26 with the second heat-dissipation plate 30.

The second heat-dissipation plate 30 comprises a rectangular-shaped second body 32. The second body 22 has a pair of long sides and a pair of short sides. A pair of protruding portions 320 are located in upper and lower ends of the rear surface of the second body 32 and a through hole 322 is defined in each protruding portion 320. Two groups of ribs 324 each having three ribs 324 formed spaced from each other on the second body 32 are arranged on opposite sides of a front surface of the second the body 32 and extending in a direction along the long sides of the second body 32. A T-shaped depressed portion 34 is defined in an edge of one of the short sides of the second the body 32 to accept the first engaging portion 244 of the first hook therein and an ear 36 is formed on an edge of the other short side of the second the body 32 to accept the second engaging portion 266 of the second hook 26 therein. The ear 36 is curved to define a notch 360 for facilitating an engagement of the second engaging portion 266 of the second hook 26 with the ear 36.

Referring to FIG. 2, in attachment of the printed circuit board 10 to the first heat-dissipation plate 20, an end of the printed circuit board 10 is inserted toward the first hook 24 of the first heat-dissipation plate 20 and is resisted by the resisting portion 242 of the first hook 24. The other end of the printed circuit board 10 is pressed against the blocking portion 264 of the second hook 26 to make the second hook 26 expand outwardly. Opposite ends of the printed circuit board 10 are tightly blocked between the resisting portion 242 of the first hook 24 and the blocking portion 264 of the second hook 26 of the first heat-dissipation plate 20. The end with the depressed portion 34 of the second heat-dissipation plate 30 is inserted towards the first hook 24 and is resisted by the resisting portion 242 of the first hook 24. The first engaging portion 244 of the first hook 24 is dropped into the depressed portion 34. The other end of the second heat-dissipation plate 30 is pressed toward the second hook 26 and the ear 36 resists the blocking portion 264 of the second hook 26 to make the second hook 26 expand outwardly. The second engaging portion 266 of the second hook 26 is clipped in the notch 360 of the ear 36 and opposite ends of the second heat-dissipation plate 30 are tightly held between the first and second hooks 24, 26 of the first heat-dissipation plate 20. The rivets 40 extend through their respective through holes 322, 12, and 222 to connect the first and second heat-dissipation plates 20, 30 and the printed circuit board 10 together.

Figure 3:
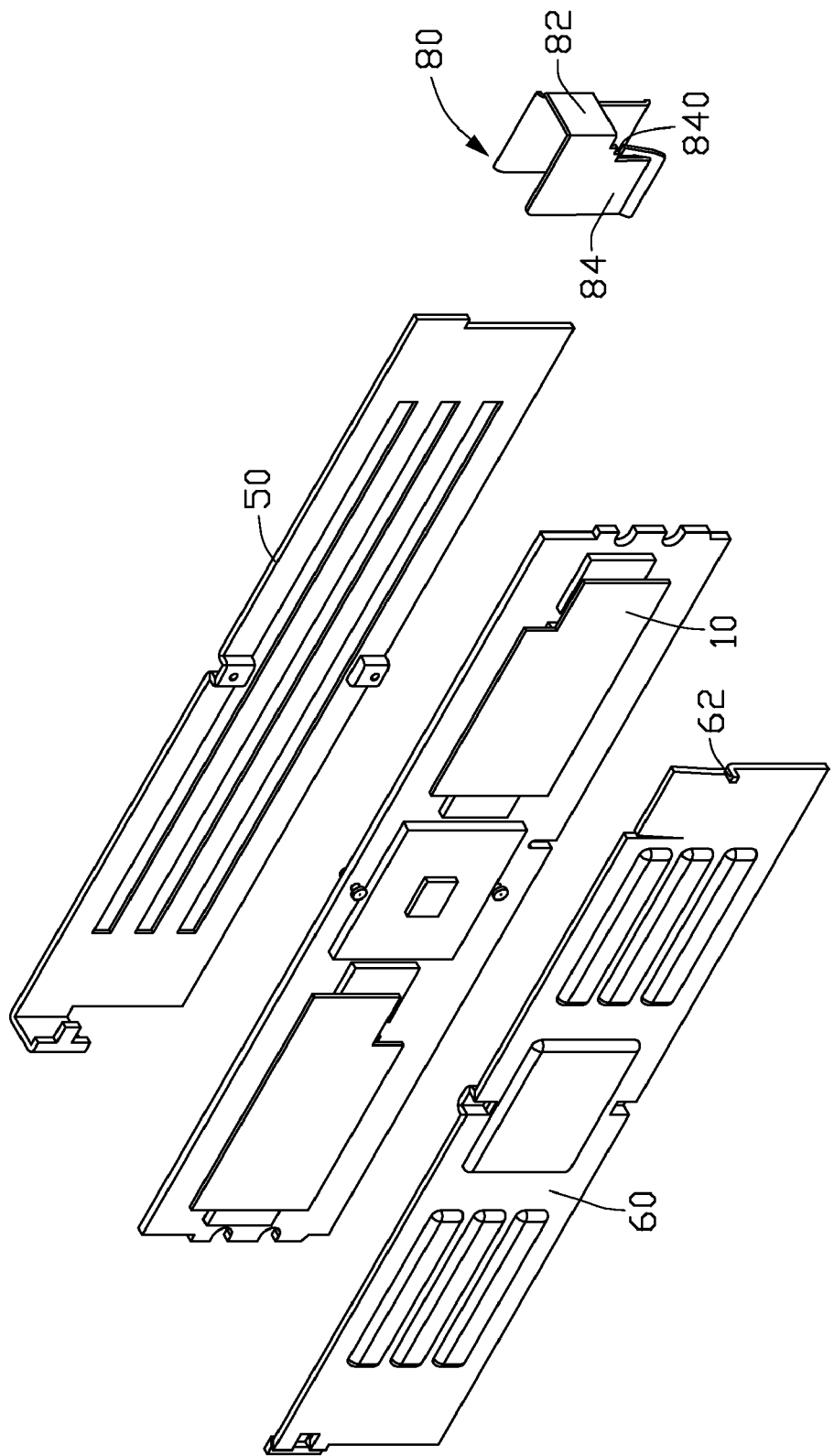
FIG. 3 is an isometric, exploded view of a memory module assembly in accordance with another embodiment of the present invention.
Figure 4:
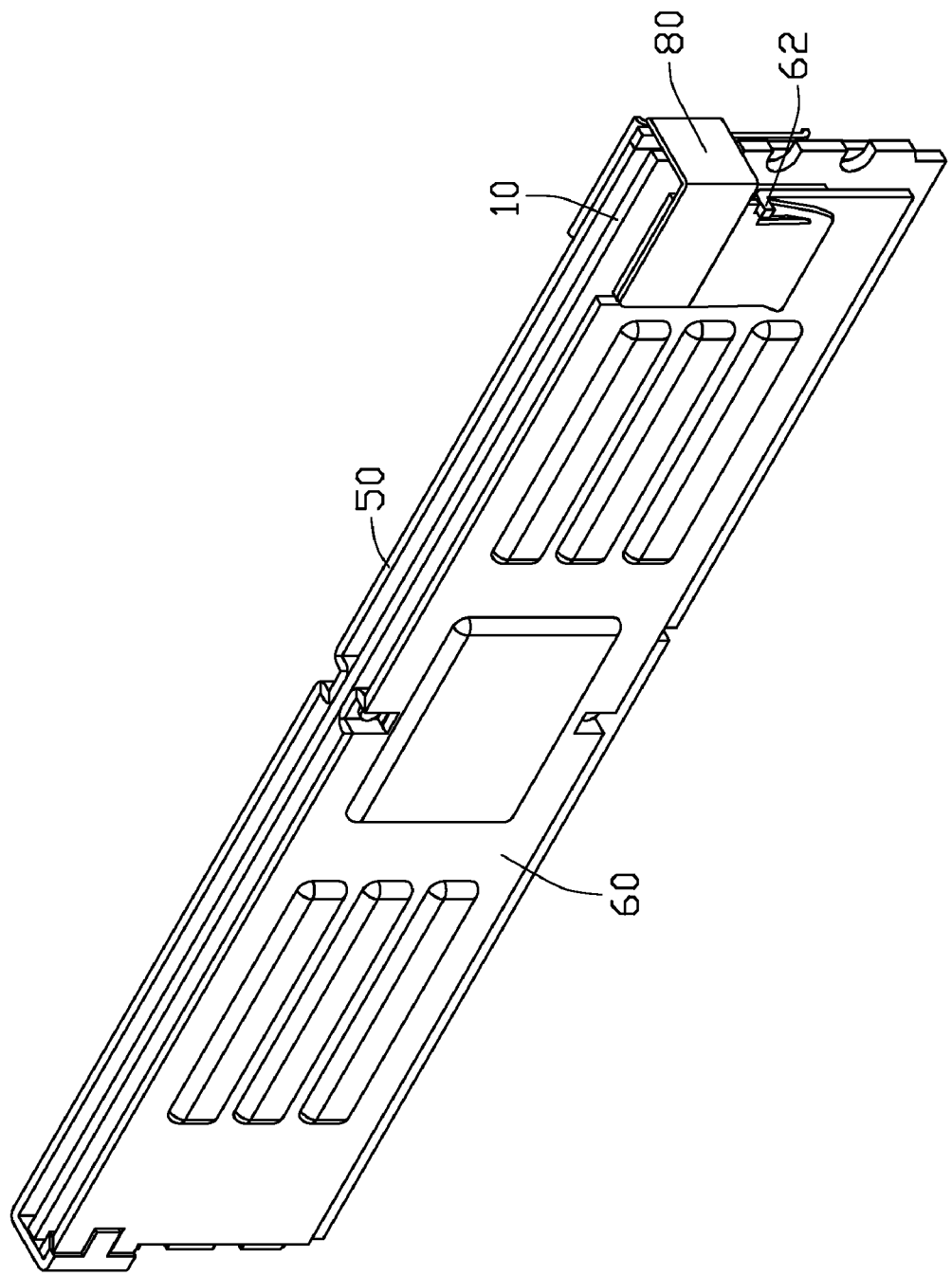
FIG. 4 is an assembled view of FIG. 3.

Referring to FIGS. 3-4, a memory module assembly is shown in accordance with another embodiment of the present invention. The memory module assembly in accordance with the second embodiment of the present invention comprises first and second heat-dissipation plates 50, 60 and a clamp 80 clamping the ends of the first and second heat-dissipation plates 50, 60 on the printed circuit board 10. The second hook 26 of the first heat-dissipation plate 20 in the first embodiment is replaced by the clamp 80 and a positioning pole 62 formed on an end of the second heat-dissipation plate 60. The clamp 80 comprises a connecting portion 82 and a pair of elastic pressing portions 84 extending from two free ends of the connecting portion 82. One of the pressing portions 84 defines an opening 840 for engaging with the positioning pole 62. When the end with the depressed portion 34 of the second heat-dissipation plate 60 and an end of the printed circuit board 10 resist the first hook 24 of the first heat-dissipation plate 50, the clamp 80 is pushed towards the other ends of the first and second heat-dissipation plates 50, 60 until the positioning pole 62 extends through the opening 840 and the pressing portion 84 is blocked by the positioning pole 62. The pressing portions 84 of the clamp 80 resiliently press the first and second heat-dissipation plates 50, 60 to be attached on front and rear surfaces of the printed circuit board 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
   a printed circuit board having an electronic heat-generating electronic component mounted on a first face of the printed circuit board;
   a first heat-dissipation plate comprising a first hook extending from a left side thereof and a second hook extending from an opposite right side thereof, the first hook comprising a resisting portion extending from an end of the first heat-dissipation plate and a first engaging portion extending from a free end of the resisting portion, for resisting the printed circuit board, the second hook comprising a section attached on a right end portion of a rear face of the first heat-dissipation plate, and a pair of locking portions extending from upper and lower ends of the section and clamping on upper and lower ends of the first heat-dissipation plate; and
   a second heat-dissipation plate defining a depressed portion in a left side thereof for engaging with said first hook;
   wherein a second engaging portion of the second hook and an oppositely opposed ear of the first and second heat-dissipation plates respectively, engage with each other to clamp the printed circuit board between the first and second heat-dissipation plates, and wherein the electronic heat-generating electronic component is thermally connected with one of the first and second heat-dissipation plates.

2. The memory module assembly as claimed in claim 1, wherein the second hook further comprises a blocking portion located at the right side of the first heat-dissipation plate and the second engaging portion extending from a free end of the blocking portion and the second heat-dissipation plate forms an ear on an opposite side thereof for receiving the second engaging portion of the second hook.

3. The memory module assembly as claimed in claim 2, wherein the second hook is an elastic piece attached on the opposite side of the first heat-dissipation plate and the two sides of the second heat-dissipation plate are held between the resisting portion of the first hook and the blocking portion of the second hook.

4. The memory module assembly as claimed in claim 3, further comprising a pair of fasteners extending in the first heat-dissipation plate, the printed circuit board and the second heat-dissipation plate to connect them together.

5. The memory module assembly as claimed in claim 2, wherein the first and second heat-dissipation plates each form a plurality of ribs thereon to strengthen the first and second heat-dissipation plates.

6. The memory module assembly as claimed in claim 5, wherein the resisting portion of the first hook and the blocking portion of the second hook are perpendicular to the first and second heat-dissipation plates respectively.

7. The memory module assembly as claimed in claim 1, wherein the first engaging portion having a T-shaped configuration, the depressed portion having a recess defined in the left end of the second heat-dissipation plate for receiving the first engaging portion therein.

8. The memory module assembly as claimed in claim 2, wherein the first engaging portion and the second engaging portion extend inwardly from opposite edges of the first heat-dissipation plate and are oriented towards each other.

9. A memory module assembly comprising:
   a printed circuit board having an electronic heat-generating electronic component mounted on a first face of the printed circuit board;
   a first heat-dissipation plate comprising a first hook extending from a left side thereof and a second hook attached on a right side thereof, the second hook comprising a section attached on a right end portion of a rear face of the first heat-dissipation plate, a pair of locking portions extending from lower and upper ends of the section and clamping on upper and lower ends of the first heat-dissipation plate, and an engaging portion extending from a right side of the section; and
   a second heat-dissipation plate forming an ear for receiving the engaging portion of the first heat-dissipation plate and the printed circuit board is sandwiched between the first and second heat-dissipation plates.

10. The memory module assembly as claimed in claim 9, wherein the second hook comprises a blocking portion extending from a right side of the section and the engaging portion extending from a free end of the blocking portion, the engaging portion engaging with the ear of the second heat-dissipation plate.

11. The memory module assembly as claimed in claim 10, wherein the first hook comprises a resisting portion extending from the left side of the first heat-dissipation plate for abutting a left edge of the printed circuit board and another engaging portion extending from a free end of the resisting portion, the engaging portion and the another engaging portion extending inwardly from opposite edges of the first heat-dissipation plate and being oriented towards each other.

12. The memory module assembly as claimed in claim 11, wherein the second heat-dissipation plate defines a depressed portion in a left side thereof for engaging with the another engaging portion.

* * * * *